United States Patent
Ho

(10) Patent No.: US 11,356,101 B1
(45) Date of Patent: Jun. 7, 2022

(54) DIGITAL SIGNAL PROCESSING BLOCK WITH REDUCED PIN COUNT FOR FINE-GRAINED PROGRAMMABLE GATE ARCHITECTURE

(71) Applicant: Efinix, Inc., Santa Clara, CA (US)

(72) Inventor: Ho Man Ho, Hong Kong (CN)

(73) Assignee: EFINIX, INC., Santa Clara, CA (US)

( * ) Notice: Subject to any disclaimer, the term of this patent is extended or adjusted under 35 U.S.C. 154(b) by 0 days.

(21) Appl. No.: 17/389,112

(22) Filed: Jul. 29, 2021

Related U.S. Application Data

(60) Provisional application No. 63/168,009, filed on Mar. 30, 2021.

(51) Int. Cl.
  *H03K 19/17736* (2020.01)
  *H03K 19/17732* (2020.01)
  *H03K 19/0175* (2006.01)

(52) U.S. Cl.
  CPC ........... *H03K 19/17744* (2013.01); *H03K 19/017581* (2013.01); *H03K 19/17732* (2013.01)

(58) Field of Classification Search
  None
  See application file for complete search history.

(56) References Cited

U.S. PATENT DOCUMENTS

| | | | | |
|---|---|---|---|---|
| 8,041,759 B1* | 10/2011 | Langhammer | ....... | H03K 19/177 326/38 |
| 8,090,758 B1* | 1/2012 | Shimanek | ............. | G06F 7/5443 708/523 |
| 2006/0075012 A1* | 4/2006 | Minz | ......................... | G06F 7/57 708/490 |
| 2006/0230096 A1* | 10/2006 | Thendean | .......... | H03K 19/1737 708/700 |
| 2010/0192118 A1* | 7/2010 | Wendling | ............... | H03H 17/06 716/117 |

* cited by examiner

*Primary Examiner* — Jany Richardson
(74) *Attorney, Agent, or Firm* — Womble Bond Dickinson (US) LLP

(57) ABSTRACT

A digital signal processing block has a first input port, a second input port, a third input port, a cascade input port and an output port. The DSP block may have a cascade output port. The DSP block may have a multiplexer that has selectable output, to the cascade output port, of concatenated inputs from the first input port, the second input port and the third input port. The DSP block may be connectable to another DSP block via a cascade path. The DSP block may have a variable shifter. The DSP block may have a full-width adder and reduced-width input ports.

20 Claims, 5 Drawing Sheets

DIGITAL SIGNAL PROCESSING BLOCK WITH REDUCED PIN COUNT FOR FINE-GRAINED PROGRAMMABLE GATE ARCHITECTURE

This application claims benefit of priority from U.S. Provisional Application No. 63/168,009 titled DIGITAL SIGNAL PROCESSING BLOCK WITH REDUCED PIN COUNT FOR FINE-GRAIN PROGRAMMABLE GATE ARCHITECTURE and filed Mar. 30, 2021, which is hereby incorporated by reference.

FIELD OF THE INVENTION

Embodiments disclosed herein relate to the field of programmable gate architectures; more particularly, embodiments disclosed herein relate to digital signal processing blocks in programmable gate architectures.

BACKGROUND

Modern field programmable gate array (FPGA) fabric architecture consists of programmable logic, programmable routing, and macro blocks like memory blocks, digital signal processing (DSP) blocks, phase-locked loops (PLLs), etc. A DSP block usually provides mathematical functions that are otherwise less efficiently implemented with programmable logic, like Integer Multiply and Add, and occasionally also the floating-point version of these.

Typically, for a DSP block, there are about 3 to 4 sets of inputs, to serve as inputs for sub-blocks like a pre-adder, a multiplier and a main adder. For the main adder, usually one input comes from the multiplier and a second input comes directly from input-pins. This second input is typically of the same width as the adder. Inputs used in the multiplier typically have widths ranging from about 17 bits to 26 bits, and for the adder typically 36 bits or 48 bits, or up to 64 bits in a 2-in-1 packed architecture.

On classical island-style programmable gate architectures, DSPs are connected to a routing fabric through connection blocks and switch blocks, and so pin counts of the DSPs depend more on connection blocks than logic elements. The same does not hold true on a fine-grained programmable architecture where there are no dedicated switch blocks, and output multiplexing (also called muxing) is built into each individual logic element. On such an architecture, the number of rows of logic elements per macro block determines the maximum supported pin count for each macro block. In both cases of classical and fine-grained architectures, a higher pin count in the DSP block translates into heavier routing congestion pressure around the DSP blocks, especially for user designs that utilize large numbers of DSPs.

It is in this environment that present embodiments arise, to present technological solutions to technological problems.

SUMMARY

Various embodiments of a DSP block are described herein. An FPGA with DSP blocks has DSP blocks that are connectable via a cascade path, in one embodiment. The DSP block can be synthesized for manufacture in an FPGA, in one embodiment. Various embodiments have a full-width adder and reduced-width input ports. One embodiment has a variable shifter.

One embodiment is a digital signal processing (DSP) block for a field programmable gate array. The DSP block has a first input port, a second input port, a third input port, a cascade input port, and an output port. The output port is to output a result of operation of the DSP block. A multiplier receives input from the first input port and the second input port. A first sign-extension block receives output of the multiplier, as input. A second sign-extension block receives input from the third input port. A first multiplexer selects for output from output of the first sign-extension block and output of the second sign-extension block. A second multiplexer selects for output from output of the second sign-extension block, a latched output of an adder, a zero value, a one value, output of the first sign-extension block, the cascade input port and the cascade input with shift. The adder receives as inputs the output of the first multiplexer and the output of the second multiplexer. A first latch latches output of the adder.

One embodiment is a tangible, non-transitory, computer-readable media. The media has instructions which, when executed by a processor, cause the processor to perform a method. The method includes synthesizing circuitry, for manufacturing a field-programmable gate array (FPGA). The FPGA includes a DSP block that has a first input port, a second input port, a third input port, a cascade input port and an output port. The method further includes synthesizing, in the DSP block, a multiplier, a first sign-extension block, a second sign-extension block, a first multiplexer, a second multiplexer, an adder and a first latch.

One embodiment is a digital signal processing (DSP) block. The DSP block has ports including a first input port, a second input port, a third input port, a cascade input port, an output port, and a cascade output port. The DSP block has blocks including a multiplier, a first sign-extension block, a second sign-extension block, a first multiplexer, a second multiplexer, a third multiplexer, an adder, a first latch, a second latch and a variable shifter.

One embodiment is a field programmable gate array. The FPGA has a first digital signal processing (DSP) block and a second DSP block. Each DSP block has a first input port, a second input port, a third input port, and an output port. Each DSP block has a multiplier and an adder. The first DSP block has a cascade input port and a multiplexer that has input from the cascade input port and multiple paths including a path from the third input port. The second DSP block has a cascade output port and a multiplexer that has output to the cascade output port and selectably outputs a concatenation of inputs from the first input port, the second input port and the third input port. The cascade input port of the first DSP block and the cascade output port of the second DSP block provide a cascade path for connecting the first DSP block and the second DSP block in the FPGA.

In one embodiment, there are multiple DSP blocks including the first DSP block and the second DSP block. Each of the DSP blocks has instantiation of the first input port, the second input port, the third input port, the output port, the cascade input port, the cascade output port, a multiplier, an adder, and the two multiplexers.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

Embodiments described herein will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments disclosed herein include a new DSP block design with a reduced pin-count requirement. In one embodiment, the DSP block design utilizes sign-extension sub-blocks for connecting inputs of reduced-width to the full-width adder inputs. For full-width access directly from input, an ABC-to-cascade-out mode enables a neighbor DSP to be used as a bypass element, by concatenating its A, B and C input ports and driving directly the cascade-out port. In one embodiment, adder feedback paths are at full width, preserving accuracies. A 1-bit shift-argument-register write-enable pin and shared C-input port are used to update the shift-argument-register of a variable-right-shifter sub-block that is unique to some embodiments of this DSP. This reduces the input pin requirement from the full-width of shift-argument down to only one bit, in various embodiments.

A digital signal processing (DSP) block design for field-programmable gate array (FPGA) with reduced pin-count requirement is disclosed in various embodiments. The DSP uses sign-extension blocks, concatenated-inputs-to-cascade-out mode, and shared-inputs for shift-argument for reduced pin counts. Some embodiments feature a digital signal processing block design for a field-programmable gate array that include one or more sign-extension blocks, concatenated-inputs-to-cascade-out, and a shared input for shift-argument, for a reduced pin-count requirement.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Figure 1:
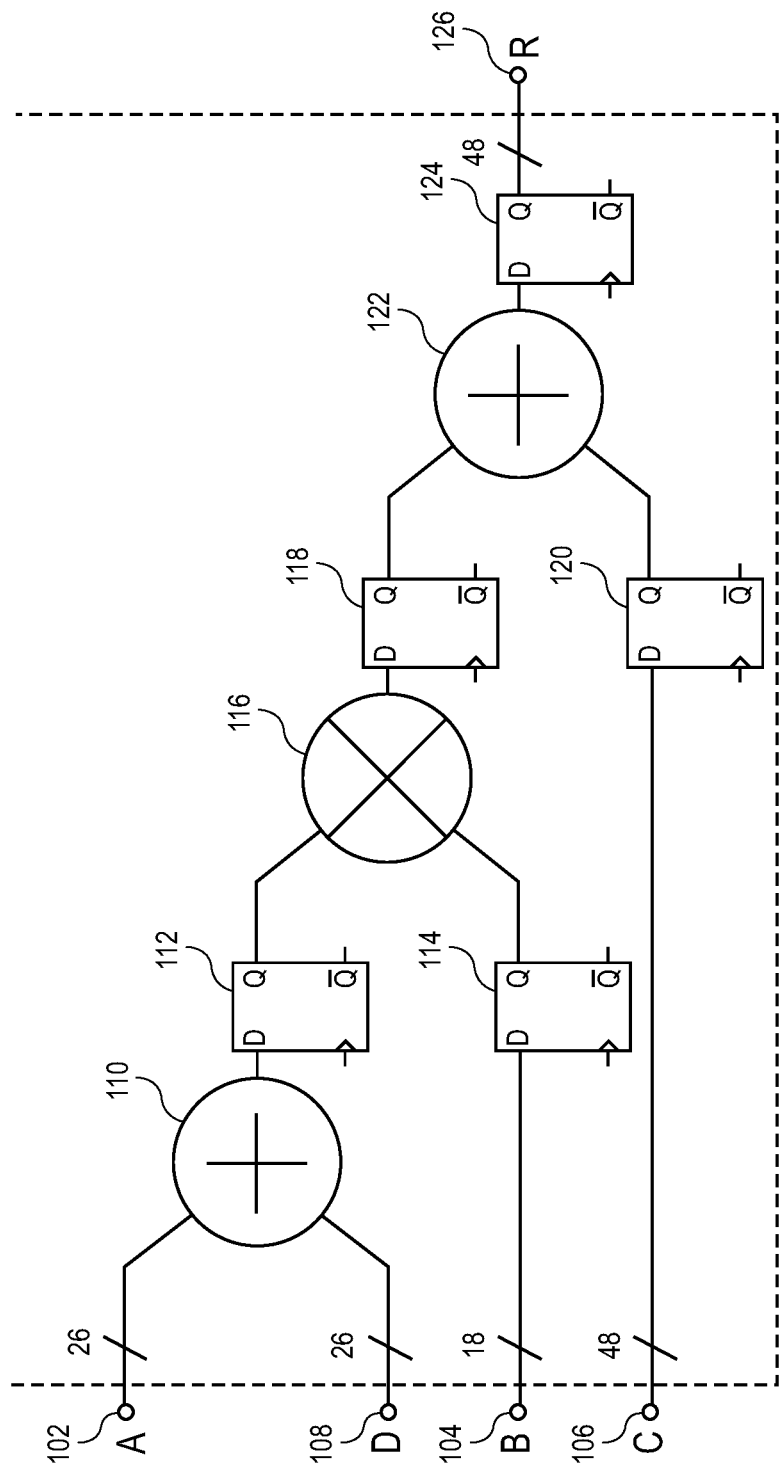
FIG. 1 represents a DSP functional design in typical FPGAs, where ports are directly connected to operators at full width.

FIG. 1 represents a typical DSP functional block design that is commonly found in many FPGAs, simplified (no path multiplexers, feedback paths, clocks, control signals, etc.) to ease discussion. Such missing details may be design-specific and hardwired or user-programmable in various FPGA embodiments as readily applied by persons of skill in the art. The input ports A, B, C and D all have their dedicated pins, and are all in full width, e.g., input ports are of the same width as the mathematic operators, e.g., adder(s), multiplier(s), consuming the input data.

This example DSP block has the following terminals, an input port 102 labeled "A", an input port 104 labeled "B", an input port 106 labeled "C", an input port 108 labeled "D", and an output port 126 labeled "R" (which may stand for result). An adder 110 has input from the input ports 102, 108, i.e., input A and input D, which the adder 110 adds, and output to the latch 112, which latches a result from the adder 110. Input from the input port 104, i.e., input B, is latched by another latch 114. A multiplier 116 has input from the latches 112, 114, which the multiplier 116 multiplies, and output to the latch 118, which latches a result from the multiplier 116. Input from the input port 106, i.e., input C, is latched by the latch 120. An adder 122 has input from the latches 118, 120, i.e., the latched result from the multiplier 116 and the latched input from input C, which the adder 122 adds, and output to the latch 124, which latches a result from the adder 122. The latched result is output at the output port 126, i.e., output R. The example DSP block may be utilized in an FPGA, e.g., in conjunction with further DSP blocks, for sums, products, products of sums, sums of products, etc. as user programmed in an implementation of a digital signal processing algorithm.

It should be appreciated that the term "latch" is intended to be broad and encompass various implementations of circuitry that have the function of latching or retaining a value of a parameter or variable. Equivalent implementations of latches include flip-flops of various types, registers of various types, clocked circuits, asynchronous circuits, and others, which may have advantages or disadvantages in various embodiments.

Figure 2:
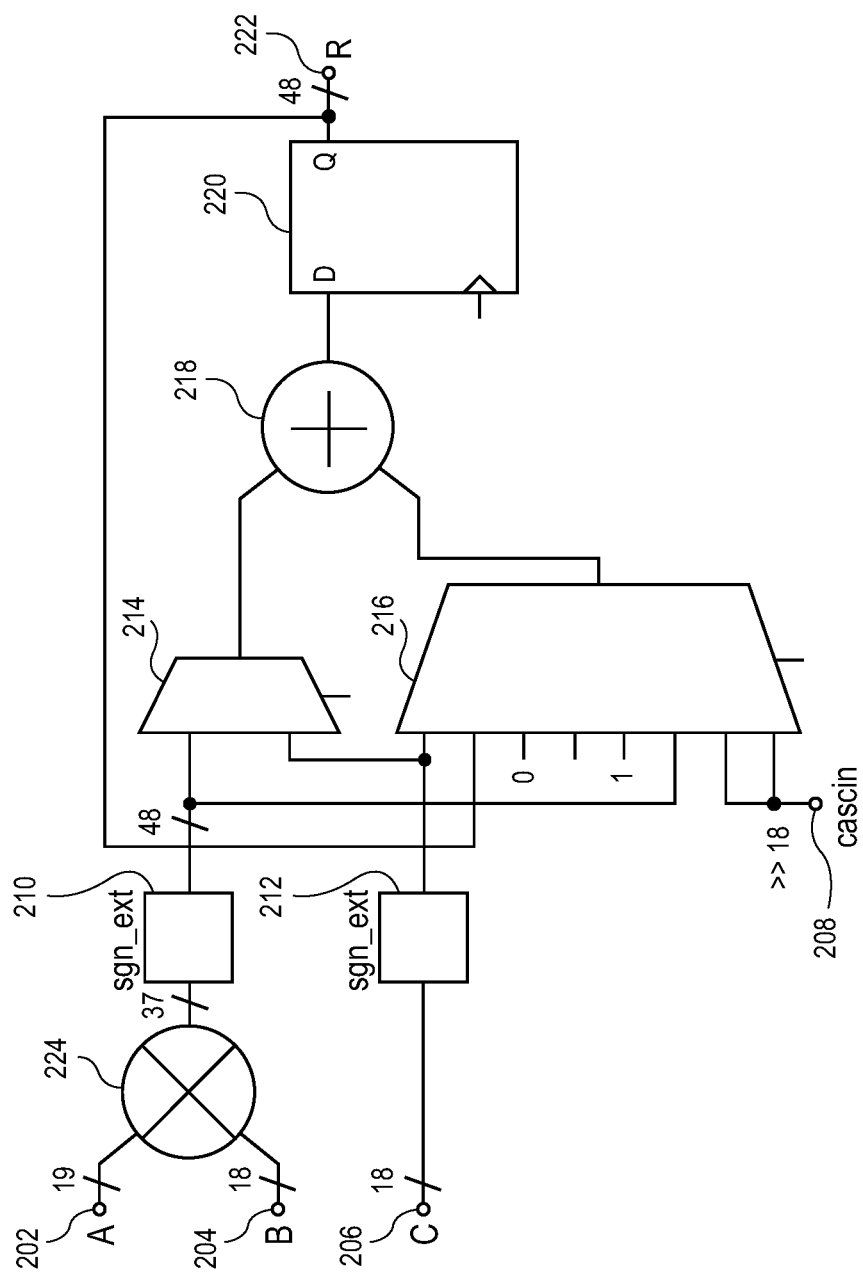
FIG. 2 illustrates use of sign-extension sub-blocks, for connecting reduced-width inputs to full-width operators, in a new pin-count-minimized DSP design in accordance with one embodiment.

FIG. 2 illustrates use of sign-extension sub-blocks in the new DSP design, for connecting input ports with "reduced width" to mathematic operators at "full width". For purposes herein, "reduced width" refers to typical input width ranges for the internal multiplier, e.g., around 18-bits, whereas full width refers to typical adder width, often at 48-bits. The term reduced-width is relative to the term full width, and the actual number of bits involved in either term may be design-dependent, and may be different among components or uniform, in various embodiments.

Referring to FIG. 2, inputs for the adder, the constant 0 and 1, the feedback path, and the cascade input (cascin) (with/without right shift by 18) are in full width. Without these, the use of a full-width adder would be pointless, or at least sub-optimal in terms of resource utilization (i.e., resulting in unused circuitry and corresponding area on an integrated circuit).

In one embodiment, the sign-extension sub-block prepends zero or performs sign-extension on the input data depending on the unsigned/signed mode with which the DSP is configured. Optionally, in one embodiment, the sign-extension sub-block can instead perform "align-left", where zeros are appended after the least-significant-bits, for uses with fixed-point arithmetic operations where the implicit integer points between different operands will need to be aligned.

Therefore, the use of sign-extension blocks reduces the pin count requirement for the second operand of the adder by more than half.

In the DSP block embodiment of FIG. 2, the DSP block has the following terminals, an input port 202 labeled "A", an input port 204 labeled "B", an input port 206 labeled "C", an input port 208 labeled "cascin" for cascade input, and an output port 222 labeled R, which may stand for result. A multiplier 224 has inputs from input ports 202, 204, i.e., input A and input B, which the multiplier 224 multiplies, and output to a sign-extension block 210, which extends the sign of the multiplier result for example by padding with zeros or ones. Another sign-extension block 212 extends the sign of the input port 206, i.e., input C. A multiplexer 214 has input from the output of the sign-extension block 210 and the output of the other sign-extension block 212, each of which is selectable for output from the multiplexer 214 to input to the adder 218. Another multiplexer 216 can selectably output from one of the inputs to the multiplexer 216, which in this example are the sign-extended input from input C from the sign-extension block 212, the latched result from the adder 218 from output of the latch 220, a zero value (i.e., "0", with the appropriate number of bits, e.g., for adding zero to another number), a one value (i.e., "1" least significant bit padded out with the appropriate number of zero bits, e.g., for incrementing an operand), the sign-extended multiplier result, from the sign-extension block 210, the cascade input from the cascade input port 208, and the cascade input right shifted, for example by 18 bits (denoted ">>18" in the drawing). Output of the multiplexer 216 is input to the adder 218, which adds outputs of the two multiplexers 214, 216. Output of the adder 218 is input to a latch 220, which outputs the latched result from the adder 218 to the output port 222, i.e., output R.

The adder 218 has full-width. Each of the input ports 202, 204, 206 has reduced-width, for which the sign-extension blocks 210, 212 compensate so that full-width paths are presented for input to the full-width adder 218. This DSP block embodiment thus has reduced pin count, in comparison to a DSP block with full-width input ports (see, e.g., FIG. 1).

Example widths are shown in FIG. 2 for one embodiment of a DSP block, as follows. Input port 202 for input A has a reduced-width of 19 bits. Input port 204 for input B has a reduced-width of 18 bits. Input port 206 for input C has a reduced-width of 18 bits. The multiplier 224 produces reduced-width output of 37 bits, which is input to the first sign-extension block 210 and output as a full-width path of 48 bits to the two multiplexers 214, 216. Output of the latch 220, and output port 228 for output R has a full-width of 48 bits. Components that have input and/or output according to the various path widths are sized accordingly. Further embodiments with other widths for paths and components are readily devised in keeping with the teachings herein.

Figure 3:
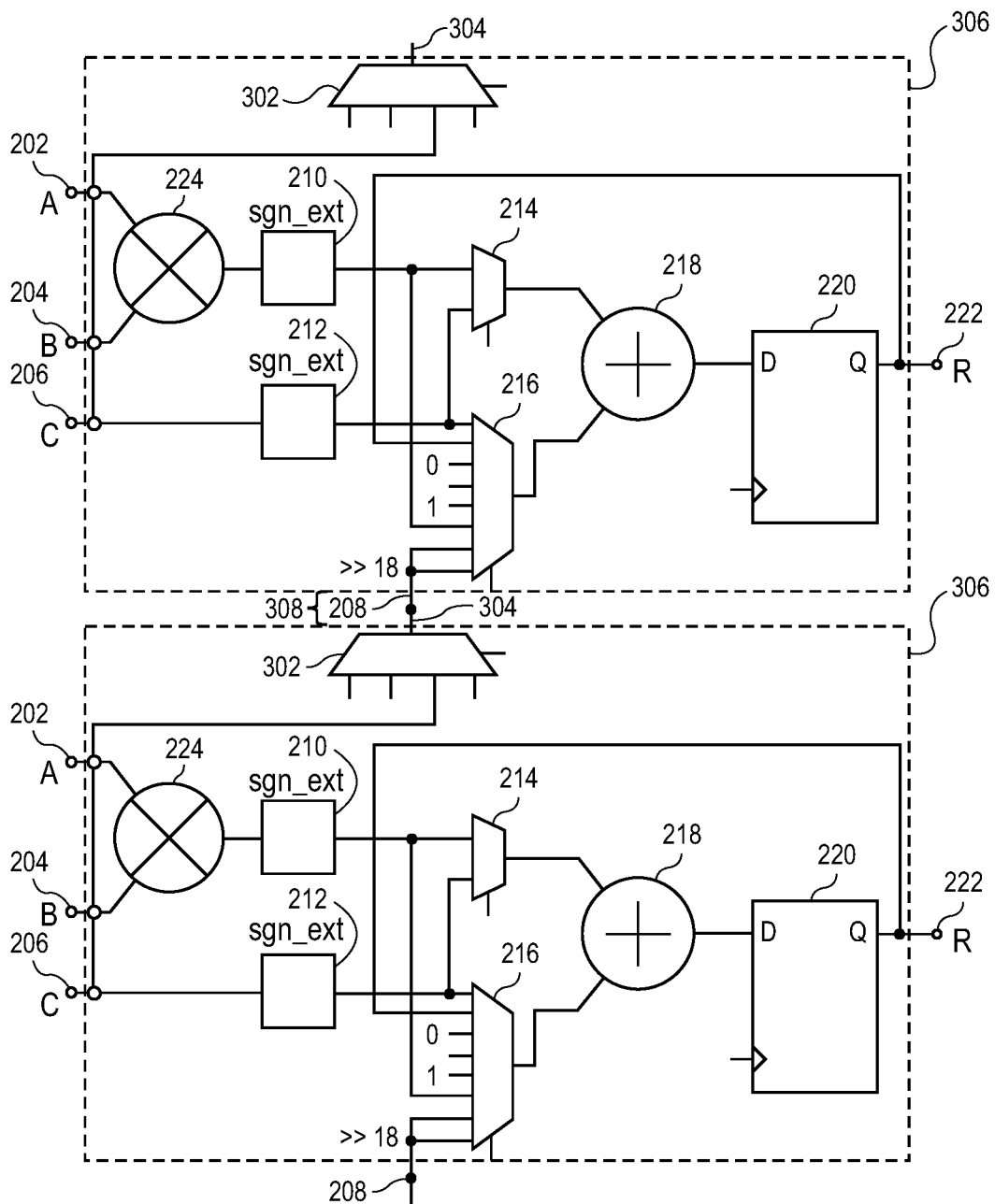
FIG. 3 illustrates use of a neighboring DSP, with a newly introduced input-concatenate mode, for a full-width input to one current DSP via a cascade path in accordance with one embodiment.

FIG. 3 shows how a "full-width" input to the adder can be applied as formed from only "reduced-width" input. A neighbor DSP can be set to have its 3 inputs concatenated and output via the cascade-out port. In some embodiments, the cascade path uses dedicated routing (non-configurable routing), which is not counted into the pin counts and is as wide as the adder's full width. This scheme allows for the flexibility when a "full-width" input is needed, while reducing the pin-count of the DSP.

The embodiment depicted in FIG. 3 shows two identical DSP blocks 306 connected together by a cascade path 308. Each of the DSP blocks 306 has the same components and connections as the DSP block embodiment illustrated in FIG. 2, plus a multiplexer 302 and a cascade-out port 304. The multiplexer 302 has input from the input ports 202, 204, 206, i.e., input A, input B and input C. The multiplexer 302 selectably outputs the concatenation of the input ports, for example all of the bits of input A followed by all of the bits of input B, followed by all of the bits of input C (or vice versa, etc.), to the cascade-out port 304.

In further embodiments, the DSP blocks 306 could have variations from each other and/or variations from the DSP block embodiment of FIG. 2. For example, one DSP block could have an instantiation of the multiplexer 302 and the cascade-out port 304, but omit the cascade-input port 208. Another DSP block could have an instantiation of the cascade-input port 208, but omit the multiplexer 302 and the cascade-out port 304. Internal blocks in DSP blocks 306 and/or internal connections could vary from one another.

The cascade-out port 304 of one DSP block 306 and the cascade-in port 208 of another DSP block 306 provide a cascade path 308. The cascade-out port 304 provides a full-width output for connection to a cascade-in port 208 via a cascade path 308. The cascade-in port 208 provides a full-width input for connection to a cascade-out port 304 via a cascade path 308. Since the concatenation of the input ports 202, 204, 206, i.e. concatenation of inputs A, B and C provides full-width, each of the input ports 202, 204, 206 can have reduced-width, thus contributing to reduced pin count of the DSP block 306.

Figure 4:
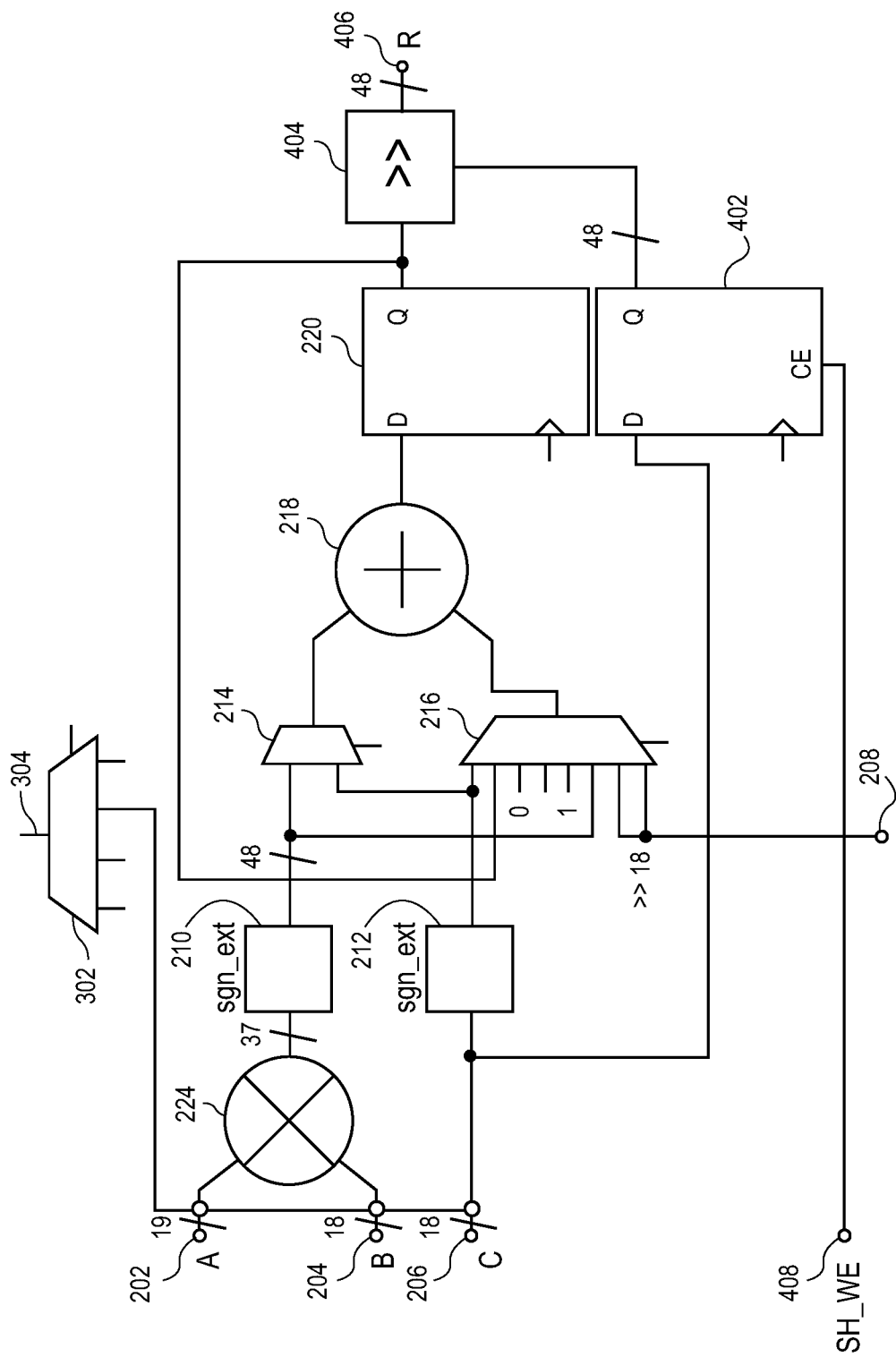
FIG. 4 illustrates a shared-input between input C and the shift-argument, and a 1-bit write-enable for updating the shift-argument register, for a unique variable right-shifter block in a new DSP in accordance with one embodiment.

FIG. 4 shows how the variable right-shifter's pin-count requirement is managed at only one bit. The variable right-shifter is a unique feature in this new DSP. If the typical design methodology is applied, the shift-argument would have been from input port directly, introducing another set of "reduced-width" inputs. Instead, the new design uses a set of registers to hold the shift-argument. The input pins are shared between these register's input and the 2nd input of the adder 218. The shift-argument register is updated only when a 1-bit write-enable input 408 pin is set. In this way, the variable right-shifter feature only increases the pin-count requirement of the DSP by one bit instead of one set of "reduced width" inputs.

The DSP block embodiment illustrated in FIG. 4 has the same components and connections as the DSP block embodiment of FIG. 3, plus another latch 402 and a variable shifter 404. The latch 402 latches input from the input port 206, input C, as the shift-argument that directs the shift of the latched output of the adder 218 by a variable number of bits. The variable shifter 404 has input from the latched output of the adder 218, from the latch 220, as the input that is to be shifted by the variable number of bits. Output of the variable shifter 404 is presented at the output port 406, i.e., output R. This DSP block embodiment is useful for DSP operations such as, for example, multiply add and shift, multiply and shift, add and shift, etc.

Figure 5:
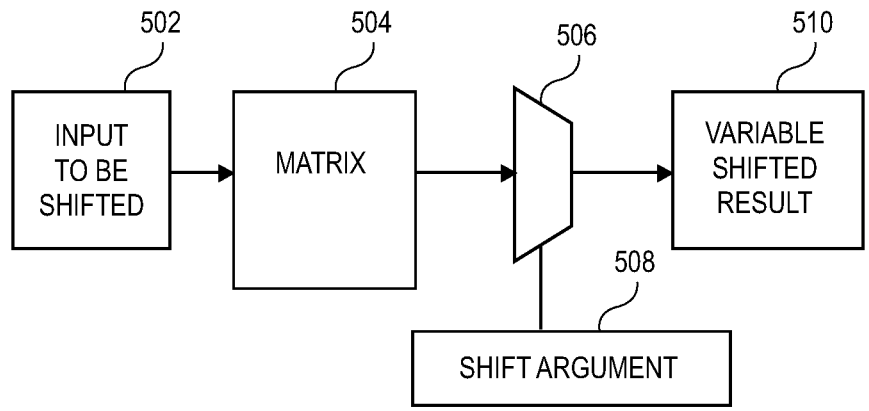
FIG. 5 illustrates an embodiment of a variable shifter that is suitable for embodiments of a DSP block.

FIG. 5 illustrates an embodiment of a variable shifter that is suitable for embodiments of a DSP block. The variable shifter could be a variable right shifter, as described above, or a variable left shifter in further embodiments (e.g., for when bit order of an operand is reversed). An input to be shifted 502 is input to a matrix 504. Output of the matrix 504 is input to a multiplexer 506. The multiplexer 506 has a select input operated by a shift argument 508, and produces a variable shifted result 510. For example operation, the multiplexer 506 selects a subset of matrix 504 output bits, according to the shift argument 508. In a further embodiment of the variable shifter, the multiplexer 506 is removed, and the shift argument 508 connects directly to the matrix 504.

The variable-right shifter, in theory, can be thought of as a barrel-shifter, so something like a 2d-grid of 2-to-1-muxes could form an implementation of a matrix 504. The shift argument 508 would then be an input to the 2d-grid of muxes, thus forming the barrel shifter. In practice, one way to implement the variable shifter is to write "operand>>arg" in RTL (register transfer language), and a synthesis tool decides what actual cells to use to build it (e.g., and/or/invert gates instead of 2-to-1-muxes). The term "matrix" is used herein to encompass an array of repeated similar or identical circuits, such as a 2d-grid of muxes or the above-described array of cells (e.g. 2-to-1-muxes) generated by a synthesis tool. Further embodiments of a matrix could be devised for further embodiments of the variable shifter. In one embodiment, fracturing techniques are applied to the "operand" part and it is actually 4 shifters as 1, to handle a fracturing feature.

Figure 6:
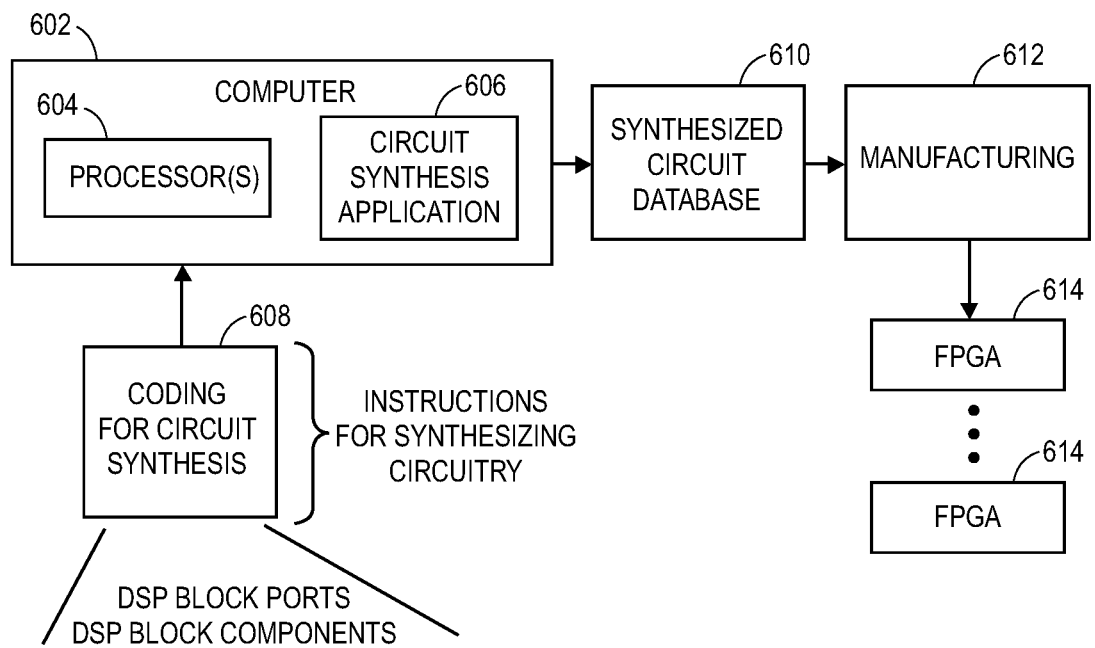
FIG. 6 illustrates circuit synthesis and manufacturing of an FPGA, as suitable for embodiments.

FIG. 6 illustrates circuit synthesis and manufacturing of an FPGA, as suitable for embodiments. A user, for example a person of skill in the art of circuit synthesis, produces coding for circuit synthesis 608, which is instructions for synthesizing circuitry (or circuits). The coding, or instructions, could be on tangible, computer-readable media of various types, in various embodiments. For example, the coding for circuit synthesis 608 could include description of DSP block ports, as instructions for synthesizing circuitry of the DSP block, and description of DSP block components, as further instructions for synthesizing circuitry of the DSP block. Component descriptions, paths, path widths, connections, and programmability should be included in the instructions for synthesizing circuitry, in various embodiments. A computer 602 that has processor(s) 604 and a circuit synthesis application 606, processes the coding for circuit synthesis 608 and produces a synthesized circuit database 610. The synthesized circuit database 610 is used for manufacturing 612, which produces FPGAs 614, for example as integrated circuits (which may be on wafers, dies, or packaged dies, etc.)

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. For a field-programmable gate array (FPGA), a digital signal processing (DSP) block, comprising:
   a first input port;
   a second input port;
   a third input port;
   a cascade-in port;
   an output port, to output a result of operation of the DSP block;
   a multiplier, to receive inputs from the first input port and the second input port;
   a first sign-extension block, to receive as input, an output of the multiplier on a first reduced-width path and connect the first reduced-width path to a first full-width path;
   a second sign-extension block, to receive input from the third input port on a second reduced-width path and connect the second reduced-width path to a second full-width path;
   a first multiplexer, to select for output from a first input group comprising the first full-width path and the second full-width path;
   a second multiplexer, to select for output from a second input group comprising the second full-width path, a latched output of an adder, a zero value, a one value, the first full-width path, a cascade input from the cascade input port, and the cascade input with shift;
   the adder, to receive as inputs the output of the first multiplexer and the output of the second multiplexer; and
   a first latch, to latch an output of the adder at least for input to the second multiplexer.

2. The DSP block of claim 1, wherein:
reduced-width is relative to full-width, each relating to bit-width;
the adder has a full-width;
each of the first input port, the second input port and the third input port has a reduced-width; and
the multiplier is matched to the reduced-width of each of the first input port and the second input port, and matched to the first reduced-width path that couples the multiplier and the first sign-extension block.

3. The DSP block of claim 1, further comprising:
a cascade-out port; and
a third multiplexer to receive input from the first input port, the second input port and the third input port, and to selectably output a concatenation of the input from the first input port, the input from the second input port and the input from the third input port to the cascade-out port.

4. The DSP block of claim 3, wherein:
the cascade-out port provides a full-width output for connection to an input of a further DSP block via a cascade path.

5. The DSP block of claim 1, wherein:
the cascade-in port comprises a full-width input for connection from an output of a further DSP block via a cascade path.

6. The DSP block of claim 1, further comprising:
a second latch to latch a shift argument from the third input port; and
a variable shifter to shift the latched output of the adder from the first latch by a variable number of bits according to the shift argument from the second latch and provide a resulting output to the output port.

7. The DSP block of claim 6, wherein:
the third input port is to function as a common input for a path to the adder and a path to the variable shifter.

8. The DSP block of claim 6, wherein the variable shifter comprises:
a matrix coupled to output of the first latch; and
a fourth multiplexer coupled to the matrix to select, for output of the variable shifter, a subset of matrix output bits according to the shift argument.

9. A tangible, non-transitory, computer-readable media having instructions thereupon which, when executed by a processor, cause the processor to perform a method comprising:
synthesizing circuitry for manufacturing a field-programmable gate array (FPGA), comprising a digital signal processing (DSP) block having a first input port, a second input port, a third input port, a cascade input port and an output port; and
further synthesizing, in the DSP block, a multiplier, a first sign-extension block, a second sign-extension block, a first multiplexer, a second multiplexer, an adder and a first latch, with the multiplier having inputs from the first input port and the second input port, the first sign-extension block having input from an output of the multiplier, the second sign-extension block having input from the third input port, the first multiplexer having selectable output from a first input group comprising output of the first sign-extension block and output of the second sign-extension block, the second multiplexer having selectable output from a second input group comprising the output of the second sign-extension block, output of the first latch, a zero value, a one value, the output of the first sign-extension block, a cascade input from the cascade input port, and the cascade input with a shift, the adder having input from output of the first multiplexer and output of the second multiplexer, the first latch having input from output of the adder.

10. The computer-readable media of claim 9, wherein the method further comprises:
further synthesizing, in the DSP block, a cascade output port and a third multiplexer, with the third multiplexer having selectable output to the cascade output port comprising a concatenation of inputs from the first input port, the second input port and the third input port.

11. The computer-readable media of claim 9, wherein the method further comprises:
further synthesizing, in the DSP block, a second latch and a variable shifter, with the second latch having input from the third input port to latch a shift argument, the variable shifter having input from output of the first latch as a result from the adder, to shift the result from the adder by a variable amount of bits according to the shift argument.

12. The computer-readable media of claim 11, wherein the further synthesizing the variable shifter comprises:
synthesizing a matrix and a fourth multiplexer, with the matrix having input from the output of the first latch, the fourth multiplexer having input from output of the second latch, for the latched shift argument, and the fourth multiplexer having input from output of the matrix, for selecting the shift by the variable amount of bits.

13. A digital signal processing (DSP) block, comprising:
a plurality of ports comprising a first input port, a second input port, a third input port, a cascade input port, an output port, and a cascade output port; and
a plurality of blocks comprising a multiplier, a first sign-extension block, a second sign-extension block, a first multiplexer, a second multiplexer, a third multiplexer, an adder, a first latch, a second latch and a variable shifter, with the multiplier having inputs from the first input port and the second input port, the first sign-extension block having input from an output of the multiplier, the second sign-extension block having input from the third input port, the first multiplexer having selectable output from a first input group comprising output of the first sign-extension block and output of the second sign-extension block, the second multiplexer having selectable output from a second input group comprising the output of the second sign-extension block, output of the first latch, a zero value, a one value, the output of the first sign-extension block, a cascade input from the cascade input port, and the cascade input with a shift, the adder having input from output of the first multiplexer and output of the second multiplexer, the first latch having input from output of the adder, the third multiplexer having selectable output to the cascade output port comprising concatenated inputs from the first input port, the second input port and the third input port, the second latch having input from the third input port, the variable shifter having input from output of the first latch to be shifted by a variable number of bits according to output of the second latch for output to the output port.

14. The DSP block of claim 13, wherein:
the cascade input port comprises a first cascade path for the DSP block to receive full-width input from a cascade output port of further DSP block;

the cascade output port provides a second cascade path for the DSP block to provide full-width output to a cascade input port of a still further DSP block.

15. The DSP block of claim 13, wherein:
the cascade input port provides a first cascade path for the DSP block to receive full-width input from concatenation of first, second and third inputs of a further DSP block via a cascade output port of the further DSP block; and
the cascade output port provides a second cascade path for the DSP block to provide full-width output from concatenation of the first, second and third inputs of the DSP block to a cascade input port of a still further DSP block.

16. The DSP block of claim 13, wherein:
the third input port provides a common input to each of the third multiplexer, the second sign-extension block and the second latch.

17. The DSP block of claim 13, wherein:
the variable shifter comprises a matrix and a fourth multiplexer;
the matrix has input from the first latch; and
the fourth multiplexer has input from the second latch and input from the matrix.

18. The DSP block of claim 13, wherein:
each of the adder, the cascade input port and the cascade output port has a full-width;
each of the first input port, the second input port and the third input port has a reduced-width; and
each of the first sign-extension block and the second sign-extension block is to connect a reduced-width path to a full-width path.

19. A field programmable gate array (FPGA), comprising:
a first digital signal processing (DSP) block and a second DSP block, each comprising:
a first input port, a second input port, a third input port, and an output port;
at least one sign-extension block;
a multiplier having inputs from the first input port and the second input port; and
an adder, coupled through a plurality of paths to the at least one sign-extension block and the multiplier;
the first DSP block further comprising a cascade input port and a first multiplexer having output coupled to an input of the adder, the first multiplexer output selectable from a first input group comprising the cascade input port and a plurality of paths including a path from the third input port;
the second DSP block further comprising a cascade output port and a second multiplexer having output to the cascade output port, the second multiplexer to selectably output to the cascade output port a concatenation of inputs of the second DSP block comprising the first input port, the second input port and the third input port; and
the cascade input port of the first DSP block and the cascade output port of the second DSP block providing a cascade path for connecting the first DSP block and the second DSP block in the FPGA.

20. The FPGA of claim 19, further comprising:
a plurality of DSP blocks, including the first DSP block and the second DSP block, each of the plurality of DSP blocks having an instantiation of the first input port, the second input port, the third input port, the output port, the cascade input port, the cascade output port, the at least one sign-extension block, the multiplier, the adder, the first multiplexer and the second multiplexer.

\* \* \* \* \*